US009618560B2

(12) United States Patent
Zhao

(10) Patent No.: US 9,618,560 B2
(45) Date of Patent: Apr. 11, 2017

(54) APPARATUS AND METHOD TO MONITOR THERMAL RUNAWAY IN A SEMICONDUCTOR DEVICE

(71) Applicant: Avago Technologies General IP (Singapore) Pte. Ltd., Singapore (SG)

(72) Inventor: Sam Ziqun Zhao, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/789,624

(22) Filed: Jul. 1, 2015

(65) Prior Publication Data

US 2017/0003339 A1    Jan. 5, 2017

(51) Int. Cl.
    *G01R 31/26*        (2014.01)
(52) U.S. Cl.
    CPC ................. *G01R 31/2628* (2013.01)
(58) Field of Classification Search
    CPC .......... H01L 21/26513; G01R 31/3606; G01R 31/362; G01R 31/3624; G01R 31/007; G06F 19/3406; G06F 3/04847; G06F 17/5036; G06F 1/325; G01N 25/4813; G01N 27/27; H04W 52/0251
    See application file for complete search history.

(56) References Cited

U.S. PATENT DOCUMENTS

| | | | |
|---|---|---|---|
| 5,574,355 A | 11/1996 | McShane et al. | |
| 6,756,804 B2 * | 6/2004 | Ishibashi | G11C 29/02 324/750.3 |
| 7,564,274 B2 | 7/2009 | Hughes | |
| 7,911,263 B2 | 3/2011 | Guo et al. | |
| 8,930,724 B2 | 1/2015 | Jung | |
| 2011/0095738 A1 * | 4/2011 | Fukuhara | H03K 17/04123 323/282 |
| 2013/0073240 A1 * | 3/2013 | Kameyama | G01K 7/01 702/65 |

OTHER PUBLICATIONS

Agarwal, et al., "Leakage Power Analysis and Reduction for Nanoscale Circuits," IEEE Micro, vol. 26, No. 2, Mar. 2006; pp. 68-80.
Black, et al., "Modeling Subthreshold Leakage and Thermal Stability in a Production Life Test Environment," IEEE 21st Annual Semiconductor Thermal Measurement and Management Symposium, Mar. 15-17, 2005; pp. 223-228.
James, D., "Broadcom Wins WiFi in Apple Watch?," Chipworks, Sep. 18, 2014; 3 pages.
Miller, M. "Next generation burn-in & test systems for Athlon microprocessors: Hybrid burn-in," Proceedings of the Burn-in and Test Socket Workshop, Mar. 4-7, 2001; 31 pages.
Taur, Y. and Ning, T.H., "Fundamentals of Modern VLSI Devices", Cambridge University Press, 1998, pp. 126-129.

* cited by examiner

*Primary Examiner* — Vinh Nguyen
(74) *Attorney, Agent, or Firm* — Sterne, Kessler, Goldstein & Fox P.L.L.C.

(57) ABSTRACT

An apparatus and methods are provided that more accurately detect the onset of thermal runaway in a device and timely control it. According to one embodiment, changes in stand-by current and temperature of a transistor device are measured and are used to be compared to some thresholds to trigger the device to respond before the onset thermal runaway. According to another embodiment, stand-by current is measured and is compared to some thresholds to trigger the device to respond before the onset thermal runaway.

22 Claims, 7 Drawing Sheets

APPARATUS AND METHOD TO MONITOR THERMAL RUNAWAY IN A SEMICONDUCTOR DEVICE

BACKGROUND

Field

The present disclosure relates generally to an apparatus and methods for monitoring thermal runaway in a semiconductor device.

Background Art

Thermal runaway refers to a situation where an increase in temperature changes the conditions in a device in a way that causes further increase in temperature. This uncontrolled positive feedback often leads to a destructive result. In semiconductor thermal runaway, with increase of device junction temperature, heat generation from device increases faster than the heat can be removed. Thermal runaway in transistor devices can result in the parts getting damaged.

Some conventional methods can monitor on-chip temperature sudden surge or monitor on-chip current sudden surge. However, there is a thermal lag between temperature sensor location and transistor(s), which introduces thermal lag time. Also, monitoring on-chip temperature sudden surge requires pre-determination of location to place on-chip temperature sensor to minimize thermal lag time. On-chip thermal hotspot may not be the "leaky spot," therefore, making the minimization of thermal lag time difficult. Also, by the time the on-chip temperature sudden surge is detected it is usually too late to prevent thermal runaway.

When monitoring on-chip current sudden surge, the measured current is a combination of dynamic current (current due to the activity of the device) and leakage current. Measuring on-chip current sudden surge has low sensitivity due to high level of dynamic current and also large current swings during the device's activities. Also, conventional methods do not define a threshold current value where the thermal runaway will occur.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

FIGS. 2a-2e illustrate flow charts of methods according to one embodiment.

Figure 1:
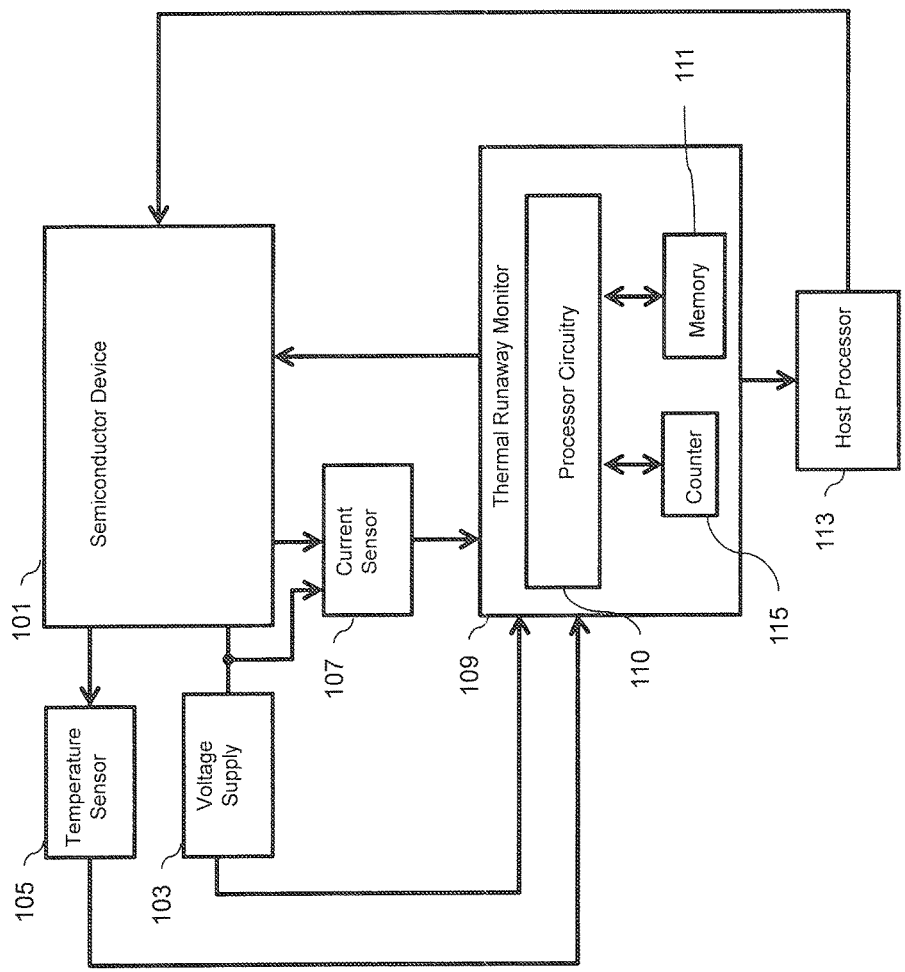
FIG. 1 illustrates a semiconductor-based apparatus incorporating a thermal runaway monitor according to one embodiment.

The present disclosure will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Overview

An apparatus and methods are provided that more accurately detect the onset of thermal runaway in a semiconductor device and timely control it. According to one embodiment, changes in stand-by current and temperature are measured and are used to be compared to some thresholds to trigger the device to respond before the onset of thermal runaway. According to another embodiment, stand-by current is measured and is compared to some thresholds to trigger the device to respond before the onset of thermal runaway.

According to one embodiment of the disclosure, a semiconductor-based apparatus includes a semiconductor device, a current sensor, a temperature sensor, and a thermal runaway monitor. The current sensor is configured to measure a first stand-by current and a second stand-by current of the semiconductor device. The temperature sensor is configured to measure a first temperature and a second temperature of the semiconductor device. The thermal runaway monitor is configured to determine a ratio of a first difference relative to a second difference, the first difference being between the first stand-by current and the second stand-by current, and the second difference being between the first temperature and the second temperature. The thermal runaway monitor is further configured to determine whether a thermal runaway onset condition exists based on the ratio.

According to another embodiment of the disclosure, a method is provided that includes measuring, using a current sensor, a first stand-by current and a second stand-by current of a semiconductor device and measuring, using a temperature sensor, a first temperature and a second temperature of the semiconductor device. The method further includes determining, using a thermal runaway monitor, a ratio of a first difference relative to a second difference the first difference being between the first stand-by current and the second stand-by current, and the second difference being between the first temperature and the second temperature. The method further includes determining, using the thermal runaway monitor, whether a thermal runaway onset condition exists based on the ratio.

According to another embodiment of the disclosure, a semiconductor-based apparatus includes a semiconductor device, a current sensor, and a thermal runaway monitor. The current sensor is configured to measure a stand-by current of the semiconductor device. The thermal runaway monitor is configured to determine a ratio of the stand-by current to a leakage current thermal runaway threshold and determine whether a thermal runaway onset condition exists based on the ratio.

According to another embodiment of the disclosure, a method is provided that includes measuring, using a current sensor, a stand-by current of the semiconductor device and determining, using a thermal runaway monitor, a ratio of the stand-by current to a leakage current thermal runaway threshold. The method further includes determining, using the thermal runaway monitor, whether a thermal runaway onset condition exists based on the ratio.

DETAILED DISCUSSION

The following Detailed Description of the present disclosure refers to the accompanying drawings that illustrate exemplary embodiments consistent with this disclosure. The exemplary embodiments will fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein. Therefore, the detailed description is not meant to limit the present disclosure.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

For the purposes of this discussion, the term "processor circuitry" shall be understood to include one or more: circuit(s), processor(s), or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal or external memory to retrieve instructions stored in the memory, which when executed by the processor, perform the corresponding function(s) associated with the processor.

FIG. 1 illustrates a semiconductor-based apparatus incorporating a thermal runaway monitor according to embodiments of the disclosure. Device 100 includes a semiconductor device 101 that can include one or more transistors, a voltage supply 103, a temperature sensor 105, a current sensor 107, a thermal runaway monitor 109, a memory 111, a counter 115, and a host processor 113. According to embodiments, thermal runaway monitor 109 includes processor circuitry 110 configured to detect whether the semiconductor device 101 is operating at a condition near the thermal runaway, and can further trigger an action to prevent thermal runaway of the semiconductor device 101. In an embodiment, the processor circuitry 110 is configured to execute logic instructions stored in memory 111 to perform the thermal runaway detection functions described herein. Temperature sensor 105 measures the temperature of semiconductor device 101 at various instances, and current sensor 107 measures the current of semiconductor device 101 at various instances, both of which are provided to the thermal runaway monitor for processing. Host processor 113 controls the overall operation of semiconductor based apparatus 100, and interacts and controls the various components as further described herein.

According to one embodiment, the metal-oxide-semiconductor field-effect transistor (MOSFET) semiconductor device thermal runaway onset condition can be determined by the following equation:

$$\frac{\partial I_{Leak}}{\partial T_J} = \frac{1}{V_{dd}\theta_{JA}} \qquad \text{Eq. (1)}$$

In other words, thermal runaway will occur if $$\frac{\partial I_{Leak}}{\partial T_J} > \frac{1}{V_{dd}\theta_{JA}}.$$

In equation (1), $I_{Leak}$ is the leakage current in semiconductor device 101. $T_J$ is the junction temperature in semiconductor device 101. $V_{dd}$ is the semiconductor device 101 core supply voltage. $\theta_{JA}$ is the semiconductor device 101 junction-to-ambient thermal resistance during normal operation of the device and/or during testing of the device.

The device junction temperature $T_J$ would be stable if heat generation from the device ($P_g$) is equal to heat dissipation from the device to ambient ($P_d$). If the heat generation from the device is greater than heat dissipation for a period of time, but heat dissipation catches up to the heat generation, then a new thermal balance can be reached at a higher junction temperature. However, if heat generation is always greater than heat dissipation, thermal runaway occurs. In other words, with an increase of device junction temperature, thermal runaway occurs when heat generation increases faster than heat dissipation/removal:

$$\frac{\partial P_g}{\partial T_J} > \frac{\partial P_d}{\partial T_J}$$

In one example, heat generation is calculated as $P_g = (I_{Dyn} + I_{Leak})V_{dd}$, where $I_{Dyn} = \alpha CV^2 f$ (where C is load capacitance) is a weak function of temperature, meaning that:

$$\frac{\partial I_{Dyn}}{\partial T_J} \ll \frac{\partial I_{Leak}}{\partial T_J}.$$

Therefore, $$\frac{\partial P_g}{\partial T_J} \approx V_{dd}\frac{\partial I_{Leak}}{\partial T_J}$$

Also, in one example, heat dissipation/removal is calculated as $P_d = (T_J - T_A)\theta_{JA}$, where $T_A$ is the ambient temperature. Assuming that $\theta_{JA}$ is a weak function of temperature (its derivative with respect to junction temperature is close to zero), then $$\frac{\partial P_d}{\partial T_J} = \frac{1}{\theta_{JA}}.$$

Therefore, to prevent thermal runaway, $$\frac{\partial P_g}{\partial T_J} < \frac{\partial P_d}{\partial T_J},$$

which results in equation (1) above.

According to one example, core supply voltage is the voltage that is supplied to the smallest transistors in semiconductor device 101. Additionally or alternatively, core supply voltage can be the voltage that is supplied to the most transistors on semiconductor device 101. $V_{dd}$ can be a fixed voltage that can be obtained as one of design parameters of semiconductor device 101 (e.g., in a data sheet) and/or can be measured from, for example, a power rail.

$\theta_{JA}$ is the semiconductor device 101 junction-to-ambient thermal resistance during normal operation of the device and/or during testing of the device. $\theta_{JA}$ is a parameter (e.g., characteristic of the material) of semiconductor device 101 that is readily available for device 101 and can be measured or simulated using, for example, thermal simulation. According to one example, $\theta_{JA}$ is known from the design of semiconductor device 101 (e.g., in a data sheet). $\theta_{JA}$ indicates that how much the temperature of a junction in device 101 changes (in degrees Kelvin or Celsius) when a pre-defined unit of heat energy flows through it in a unit of time. For example, if $\theta_{JA}$=25 degrees Celsius/W and semiconductor device 101 is dissipating 1 W of power, then at room temperature, the temperature of semiconductor device 101 will increase 25 degree Celsius over the room temperature. So if the room temperature is 25 degree Celsius semiconductor device 101 is running at 50 degree Celsius when dissipating one watt of power. $\theta_{JA}$ is fairly stable in application temperature range.

According to one embodiment of the disclosure, the changes in stand-by current and temperature of semiconductor device 101 can be measured and therefore, thermal runaway condition of semiconductor device 101 can be monitored using equation (1). Leakage current in equation (1) can be replaced with the stand-by current, which is more includes leakage current and current caused by background processes, as will be discussed below.

According to one example, device 100 includes a voltage supply 103 that is configured to supply power to semiconductor device 101. Although voltage supply 103 is illustrated separate from semiconductor device 101, it is noted that voltage supply 103 can be part of semiconductor device 101 (i.e. on-chip). Additionally or alternatively, voltage supply 103 can include or be connected to a power management unit that supplies the supply voltage to semiconductor device 101. According to this embodiment, thermal runaway monitor 109 is configured to measure semiconductor device 101 core supply voltage by, for example, measuring the voltage at voltage supply 103, for example, where voltage supply 103 is connected to voltage supply pins of semiconductor device 103. However, thermal runaway monitor 109 can be configured to measure the supply voltage at semiconductor device 101, a power management unit (not shown), or any combination thereof. In one example, thermal runaway monitor 109 measures (and/or obtains) the supply voltage once during thermal runaway monitoring of semiconductor device 101 and uses the measured supply voltage in its monitoring. Alternatively or additionally, thermal runaway monitor 109 can measure the voltage supply periodically over time, for example, each time that thermal runaway monitor 109 measures the stand-by current and temperature of semiconductor device 101, the voltage supply can also be determined.

According to this embodiment, thermal runaway monitor 109 is further configured to use semiconductor device 101 junction-to-ambient thermal resistance (i.e. $\theta_{JA}$ above) in monitoring semiconductor device 101. In one example, junction-to-ambient thermal resistance is a pre-defined known value that is derived from semiconductor device 101, as provided in a data sheet, or provided by the semiconductor manufacturer that was used to make the semiconductor device 102. Additionally or alternatively, thermal runaway monitor 109 can measure junction-to-ambient thermal resistance from semiconductor device 101. In one example, junction-to-ambient thermal resistance can be measured using temperature sensor 105 or can be estimated using a thermal modeling. In one example, measuring junction-to-ambient thermal resistance can be done when semiconductor device 101 is at an active mode. Additionally or alternatively, measuring junction-to-ambient thermal resistance can be done when semiconductor device 101 is at stand-by mode. In this example, stand-by mode for semiconductor device 101 can be a mode when semiconductor device 101 is performing no activity related to any applications. In other words, stand-by mode for semiconductor device 101 is a mode absent of any functional applications that semiconductor device 101 is tasked to do by an external entity (such as host processor 113). Stand-by mode for semiconductor device 101 can include the continuation of some background activities that draw current, such as bias currents. For example, if the semiconductor device represents an application processor in whole or in part, then application processing would temporarily cease in stand-by mode, but the bias current(s) will still be active. Leakage current, on the other hand, is a current that runs through the components of semiconductor device 101 (e.g., transistors) when those components are intended to be off and/or no current should run through them (e.g., ideal current is zero). For example, leakage current for a field effect transistor (FET) would be the current measured when the FET is switched off using the gate voltage, but there is still some gate-to-source and/or drain-to-source leakage current assuming adequate drain voltage.

According to this embodiment, thermal runaway monitor 109 is configured to measure stand-by current and temperature of semiconductor device 101 and use equation (1) to determine whether semiconductor device 101 is close to a thermal runaway condition. In this example, thermal runaway monitor 109 is configured to set semiconductor device 101 in a stand-by mode and measure stand-by current of semiconductor device 101 using current sensor 107. According to one example, current sensor 107 can measure the stand-by current at voltage supply 103, for example, where voltage supply 103 is connected to voltage supply pins of semiconductor device 103. However, current sensor 107 and/or thermal runaway monitor 109 can be configured to measure the stand-by current at semiconductor device 101, a power management unit (not shown), or any combination thereof. The stand-by current measured is a combination of the leakage current and any background current due to background activities of semiconductor device 101 performed during its stand-by mode.

In this example and during the stand-by mode, thermal runaway monitor 109 is also configured to measure the temperature of semiconductor device 101 using, for example, temperature sensor 105. Additionally or alternatively, temperature sensor 105 (and/or thermal runaway monitor 109 through temperature sensor 105) can continuously measure the temperature of semiconductor device 101. In embodiments, continuous temperature measurement occurs as discrete measurements in a periodic or aperiodic manner irrespective of device mode. In one example, the temperature of semiconductor device 101 can be measured before the semiconductor device 101 is set to stand-by mode. In another example, the temperature of semiconductor device 101 can be measured after semiconductor device 101 resumes its normal operation. In a further example, the temperature of semiconductor device 101 can be measure before stand-by mode, during stand-by mode, and/or after stand-by mode and an average of the measured temperature can be used for thermal runaway monitoring. Although temperature sensor 105 and current sensor 107 are illustrated as being separate from semiconductor device 101 and thermal runaway monitor 109, it is noted that temperature sensor 105 and current sensor 107 can be an intergrated part of semiconductor device 101 and/or thermal runaway monitor 109 or any combination thereof. The duration of the stand-by mode can be determined based on the time that is required to measure the stand-by current and temperature. In an embodiment, the duration of the stand-by mode is as short as possible to mitigate interruption of the normal operation (active mode) of the device 100. In another embodiment, the measurement duration is longer to average out any fluctuations in the measurements.

After measuring the stand-by current and temperature, thermal runaway monitor 109 can instruct semiconductor device 101 to resume its normal operations (e.g., active mode) for a given number of clock cycles so that the dynamic current/power will cause enough change of device temperature from that of the stand-by mode. The duration of device in active mode can be substantially longer than the duration of device in stand-by mode such that overhead impact of reactivating the device from stand-by is minimal to device performance. For example, the active mode for semiconductor device 101 can be 20-100 times longer than the stand-by mode. In this example, the number of cycles for active mode activities can be selected based on the target duration of the active mode. Other factors can be considered in determining the duration of the active mode. For example, semiconductor device 101 temperature change rate in the active mode and thermal runaway monitor 109 response time for detecting and stopping thermal runaway can be considered in determining the active mode duration.

After the active mode, thermal runaway monitor 109 can set semiconductor device 101 to another stand-by mode by turning off one or more, or all activities. Thermal runaway monitor 109 again measures stand-by current and the temperature of semiconductor device 101 using, for example, current sensor 107 and temperature sensor 105, respectively. As discussed above, the temperature of semiconductor device 101 can be measured continuously and this disclosure is not limited to stand-by temperature. After measurements are performed, thermal runaway monitor 109 can set semiconductor device 101 to another active mode. These measurements can be repeated over multiple cycles during the operation of semiconductor device 101. Thermal runaway monitor 109 uses the measured stand-by current and measured temperature to determine changes over time in stand-by current and temperature and then uses equation (1) to determine whether semiconductor device 101 is close to the onset of thermal runaway. Depending on this determination, thermal runaway monitor 109 can perform further actions to protect semiconductor device 101. According to one example, thermal runaway monitor 109 can send a warning message to host processor 113 if thermal runaway monitor 109 detects that semiconductor device 101 is close to thermal runaway. In response, host processor 113 can, for example, send a signal to semiconductor device 101 or turn on an indicator (such as a thermal runaway indicator, a text message, a light, a speaker, etc.) that would indicate that semiconductor device 101 is close to thermal runaway. Additionally or alternatively, thermal runaway monitor 109 can directly send a signal to semiconductor device 101 or turn on the indicator that would indicate that semiconductor device 101 is close to thermal runaway. Other mitigating options are further discussed below with respect to FIGS. 2a-2c and 3a-3c below.

In one example, thermal runaway monitor 109 calculates a ratio of change in stand-by current and change in temperature as follows:

$$\left[\frac{\Delta I}{\Delta T}\right]_i = \frac{I_i - I_{(i-1)}}{T_i - T_{(i-1)}}$$

or $$\left[\frac{\Delta I}{\Delta T}\right]_i = \frac{I_i - I_{(i-2)}}{T_i - T_{(i-2)}}$$

where i=2, 3, 4, 5, . . . n.

It is noted that the change in stand-by current and temperature can be calculated at any two instances in time where stand-by current and temperature has been measured. According to this example, thermal runaway monitor 109 further calculates a parameter $k_i$ using the calculated ratio and measured supply voltage and junction-to-ambient thermal resistance as follows:

$$k_i = \left[\frac{\Delta I}{\Delta T}\right]_i \bigg/ \left[\frac{1}{V_{dd}\theta_{JA}}\right].$$

Parameter $k_i$ is calculated based on equation 1. Based the discussion of Eq. 1, any $k_i \geq 1$ is an indication of thermal runaway for the semiconductor device 101, and therefore some mitigation of the device operation should occur to prevent damage. According to one example, thermal runaway monitor 109 compares parameter $k_i$ with a preset upper control limit (UCL) value ($k_{UCL}$) to determine whether semiconductor device 101 is close to the thermal runaway triggering condition. According to one example, $k_{UCL}$=80% so that there is a 20% margin from theoretical thermal runaway onset condition. It is noted that other values of $k_{UCL}$ can also be considered. In one example if $k_i < k_{UCL}$, then semiconductor device 101 can continue its operation without any concerns for thermal runaway. However, if $k_i \geq k_{UCL}$, then thermal runaway monitor 109 can send a warning message to host processor 113 to notify that semiconductor device 101 is close to a thermal runaway condition. As discussed above, host processor 113 can, for example, send a signal to semiconductor device 101 or turn on an indicator to indicate that semiconductor device 101 is close to thermal runaway. Additionally or alternatively, thermal runaway monitor 109 can directly send a signal to semiconductor device 101 or turn on the indicator.

According to one embodiment, device 100 is a cellular phone, where semiconductor device 101 can include a processing unit, such as an application processor. Thermal runaway monitor 109 can be configured to monitor stand-by current and temperature of the processing unit and the institute necessary measures described herein. As the use for cell phones (e.g., smart phones) increases there is a need for faster and smaller processing units. Faster processing units can result in more heat generation. Also, the semiconductor design methods are advancing from 40 nanometer (nm) in size to 28 nm, and to 14 nm. As the processing methods become more advanced, the leakage currents become more important because of, for example, short channel effects. These issues increase the thermal runaway concerns for processing units of, for example cell phones.

In another embodiment, device 100 can include enterprise networking equipment, as another example. In this example, semiconductor device 101 can include networking processors and/or security processors that operate in high temperature environment. Thermal runaway due to a leakage spike with temperature could be a risk in application and/or engineering testing. Thermal runaway monitor 109 can therefore be used effectively to monitor the device and prevent thermal runaway.

Figure 2A:
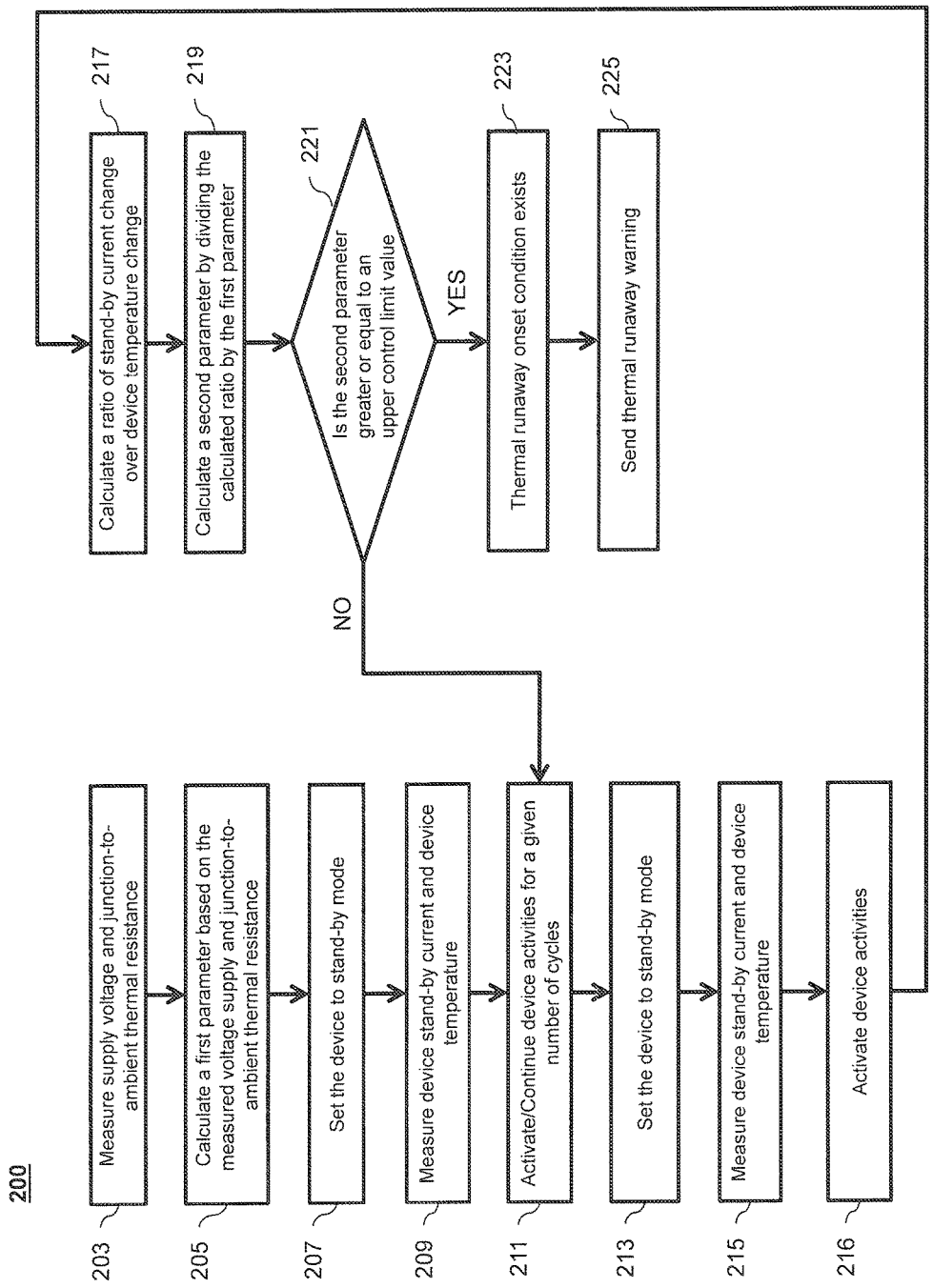
Figure 2B:
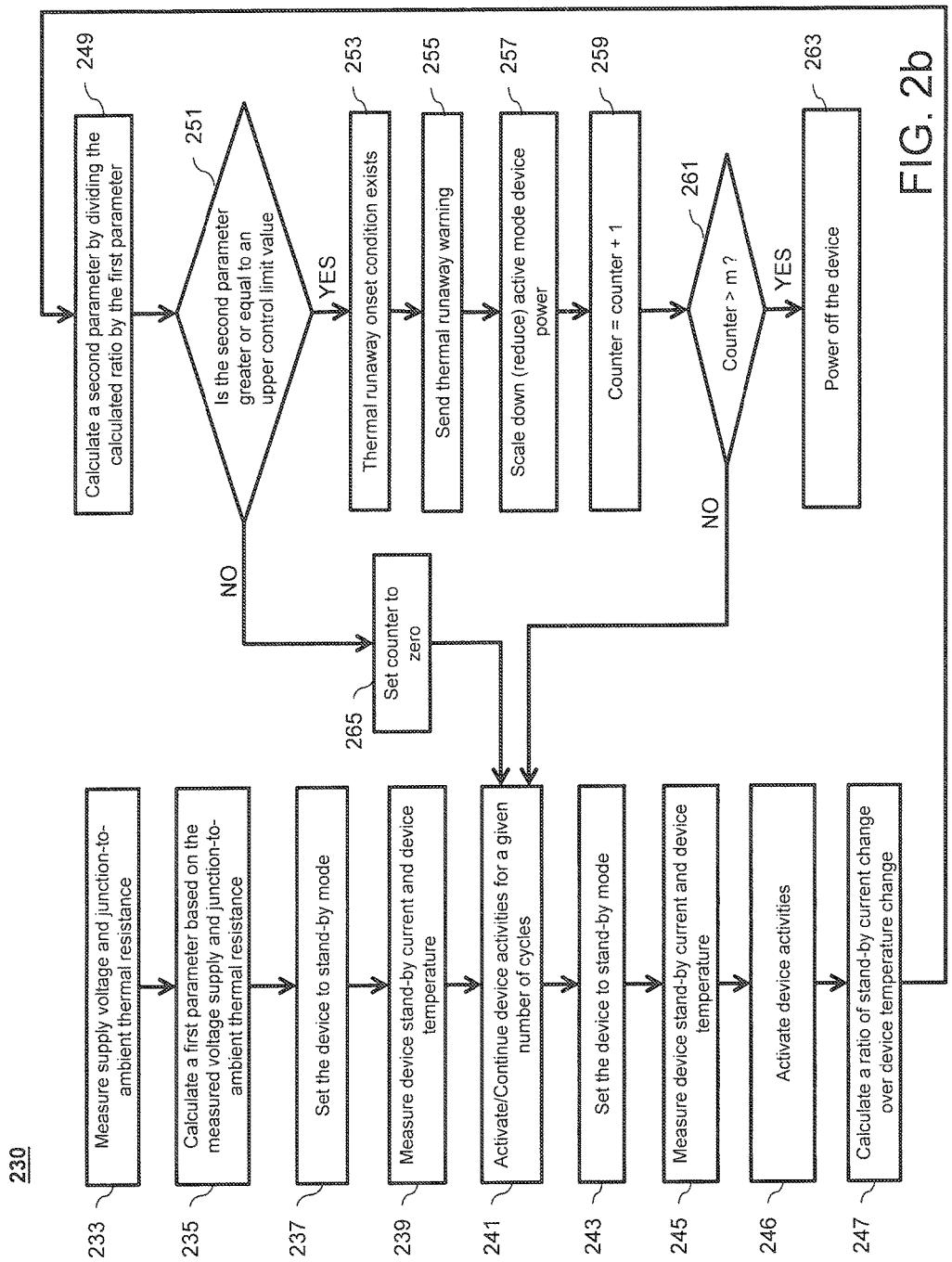
Figure 2C:
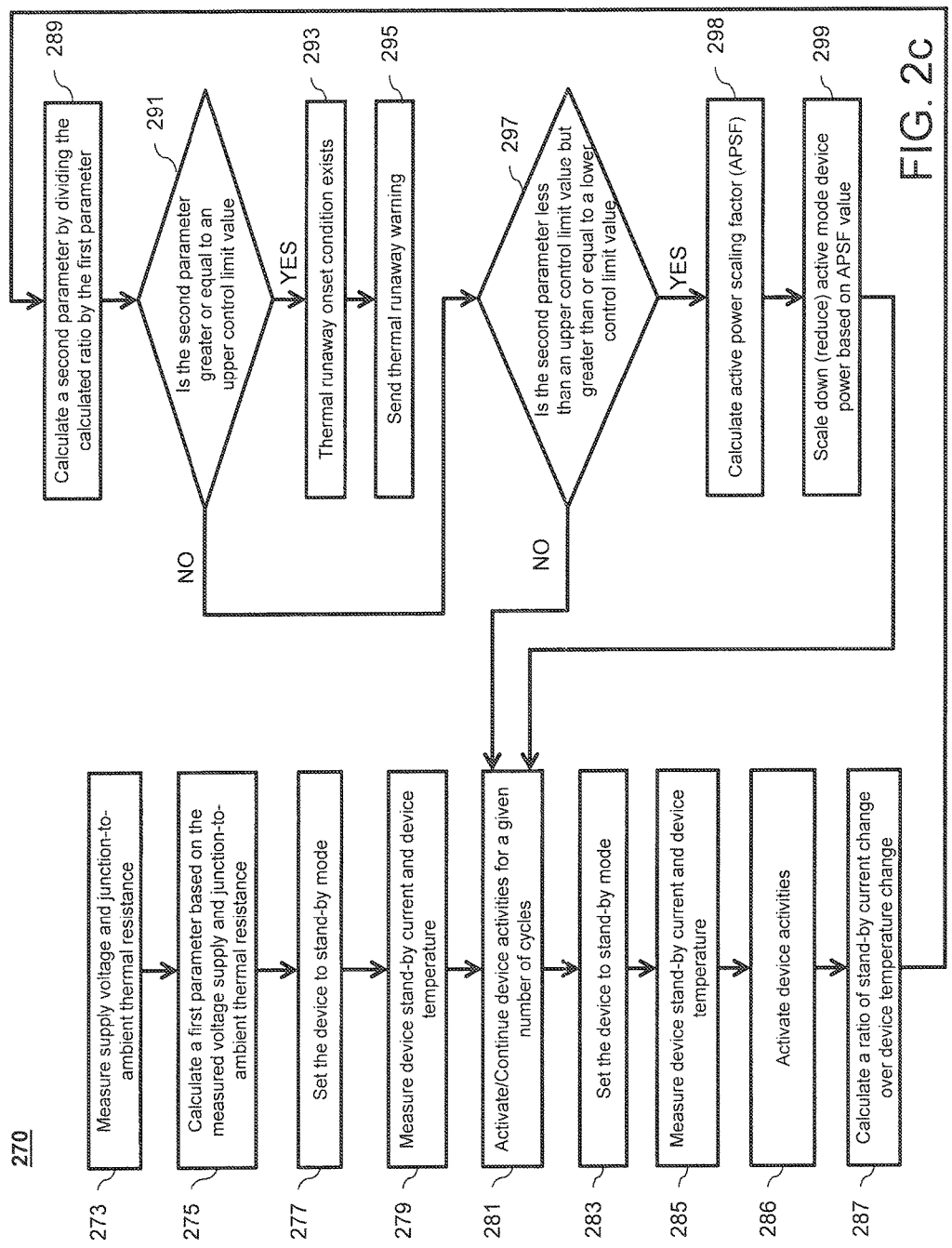

FIGS. 2a-2c illustrate flow charts of methods 200, 230, and 270 carried out by the device 100 shown in FIG. 1, in accordance with an embodiment of the present disclosure. It is to be appreciated not all steps may be needed to perform disclosure provided herein. Further, some of the steps may be performed simultaneously, or in a different order than that shown in FIGS. 2a-2c, as will be understood by those skilled in the art.

According to one example, methods 200, 230, and 270 of FIGS. 2a-2c can be performed by thermal runaway monitor 109 alone, or in accordance with one or more of temperature sensor 105, current sensor 107, memory 111, and host processor 113.

FIG. 2a illustrates a flowchart of method 200 according to one embodiment.

In step 203, the supply voltage and junction-to-ambient thermal resistance is measured and/or obtained. The supply voltage and junction-to-ambient thermal resistance is measured and/or obtained during normal operation of semiconductor device 101, during a stand-by mode, and/or is predetermined when semiconductor device 101 is turned off. As discussed above, thermal runaway monitor 109 alone or in combination with other circuits in device 100 can measure the supply voltage and junction-to-ambient thermal resistance. The thermal runaway monitor 109 can read the supply voltage at the input pins to the semiconductor device 100. Also, it is noted that these measurements can either occur once or can be done multiple times during the operation of semiconductor device 101 to capture any changes that might occur in the supply voltage and/or junction-to-ambient thermal resistance for more accurate monitoring of thermal runaway. Alternatively or additionally, thermal runaway monitor 109 can obtain these values from semiconductor device 101 without measurement and without interruption as these values can be fixed, or predetermined known values. For example, the junction-to-ambient thermal resistance can be predetermined and listed on a data sheet, and/or provided by the semiconductor manufacture, and thus pre-stored in the memory 111 for future access.

In step 205, a first parameter is calculated by the thermal runaway monitor 109 based on the measured/obtained supply voltage and junction-to-ambient thermal resistance. For example, the first parameter is calculated as $$\frac{1}{V_{dd}\theta_{JA}},$$

where $V_{dd}$ is the supply voltage, and $\theta_{JA}$ is the semiconductor device junction-to-ambient thermal resistance. In step 205, the calculated first parameter can be stored in, for example, memory 111 for further use. In one example, after this calculation, and if the measurements and calculations has occurred during a stand-by mode, thermal runaway monitor 109 can send a signal to semiconductor device 101 to continue its normal activities and transition to active mode. Alternatively, the semiconductor device 101 can already be in active mode.

After a predetermined number of clock cycles in the active mode for semiconductor device 101, the thermal runaway monitoring can continue by setting semiconductor device 101 to stand-by mode in step 207. According to one example, semiconductor device 101 is performing its applications when thermal runaway monitor 109 sends an interruption message in step 207 to interrupt semiconductor device 101 activities and put it in a stand-by mode. The duration of the stand-by mode can be determined based on the time required for measuring (e.g., sensing) stand-by current and temperature. In one example, the stand-by mode can be less than 1-2 millisecond around 10 microsecond.

In step 209, semiconductor device 101 stand-by current and temperature can be measured at a first instance of time. More specifically, the stand-by current and temperature can be measured by the temperature sensor 105 and the current sensor 107, respectively, and the measured values can be forwarded to the thermal runaway monitor 109. In one example, supply voltage can also be measured again in this step by the thermal runaway monitor 109 reading the supply pins. As discussed above, the temperature of semiconductor device 101 can be measured continuously, and this disclosure is not limited to stand-by mode temperature measurement. In other words, the temperature can be measured right before the semiconductor device 101 is set in stand-by mode, during the stand-by mode, after semiconductor device 101 is set to active mode, or any combination thereof. In embodiments, continuous temperature measurement occurs as discrete measurements in a periodic or aperiodic manner irrespective of device mode.

In step 211, semiconductor device 101 is set to active mode by activating the semiconductor device 101's functional activities for a given number of clock cycles, where the dynamic current/power will likely change the device temperature from that of the stand-by mode. In an embodiment, it is desirable to minimize the disruption of the active mode by the stand-by mode, so as to limit the disruption of the functional activity of the semiconductor device 101. However, if the active mode is allowed to run too long, there is a risk of thermal runaway occurring without being detected. If the active mode duration is too short, then the device activities will be slowed down and normal operation will be affected. It is desired that the time duration of stand-by mode be kept as short as possible so that device can perform its normal operation. Further, the temperature will not likely change substantially over the period of stand-by mode. In one example, stand-by mode will not cause substantial temperature change of the device because of its short duration and device thermal time constant is substantially longer.

In step 213, semiconductor device 101 is set to stand-by mode again. In step 215, the semiconductor device 101 stand-by current and temperature are measured at a second instance of time, similar to that discussed above for the first instance. In one example, the supply voltage can also be measured again in this step. In step 216, semiconductor device 101 is set to active mode again by activating the semiconductor device 101's normal functional activities. In step 217, a ratio of stand-by current change over device temperature change is calculated by the thermal runaway monitor 109 for the two instances as:

$$\left[\frac{\Delta I}{\Delta T}\right]_i = \frac{I_i - I_{(i-1)}}{T_i - T_{(i-1)}}$$

or $$\left[\frac{\Delta I}{\Delta T}\right]_i = \frac{I_i - I_{(i-2)}}{T_i - T_{(i-2)}};$$

where i=2, 3, 4, 5, . . . , n.

The currents measured in steps 209 and 215 are stand-by currents that include leakage currents and any other currents related to background activities of semiconductor device 101. Although semiconductor device 101 is in stand-by mode, some background activities may contribute to the measured stand-by current. However, since the change in stand-by currents is calculated (e.g., differential calculation) in step 217, the effects of background activities in determining thermal runaway onset is minimized and generally cancel out.

In step 219, a second parameter is calculated by the thermal runaway monitor 109 by dividing the calculated ratio of stand-by current change over device temperature change by the first parameter, $$\frac{1}{V_{dd}\theta_{JA}},$$

to provide:

$$k_i = \left[\frac{\Delta I}{\Delta T}\right]_i / \left[\frac{1}{V_{dd}\theta_{JA}}\right].$$

In step 221, parameter $k_i$ is compared by the thermal runaway monitor 109 to a preset upper control limit (UCL) value ($k_{UCL}$) to determine whether semiconductor device 101 is close to a thermal runaway triggering condition. According to one example, $k_{UCL}$=80% so that there is a 20% margin from theoretical onset condition of thermal runaway. It is noted that other values of $k_{UCL}$ can also be considered. For example, for some semiconductor devices, the value of $k_{UCL}$ can be set to 50% or less or 90%, 95%, 98%, or 99%. The value of $k_{UCL}$ can depend on device 100 and/or semiconductor device 101 and/or the application(s) used on semiconductor device 101. If $k_i < k_{UCL}$, the method continues in step 211, where semiconductor device 101 continues its normal activities in active mode and the thermal runaway indicator is off. In this example, steps 217-221 are performed during active mode operation of semiconductor device 101. However, these steps can be performed during stand-by mode or a combination of active and stand-by modes.

If $k_i \geq k_{UCL}$, in step 223, it is determined that a thermal runaway onset condition exists. In step 225, thermal runaway monitor 109 can send a warning message to host processor 113 that semiconductor device 101 is close to the thermal runaway condition. As discussed above, host processor 113 can, for example, send a signal to semiconductor device 101 or turn on an indicator (e.g. LED light, text message, sound, etc.) to indicate that semiconductor device 101 is close to thermal runaway. Additionally or alternatively, thermal runaway monitor 109 can directly send a signal to semiconductor device 101, or turn on the indicator.

FIG. 2b illustrates another method for determining and controlling thermal runaway of semiconductor device 101 according to an embodiment of this disclosure. Steps 233-249 of method 230 of FIG. 2b are similar to steps 203-219 of method 200 of FIG. 2a, and therefore will not be repeated here.

In step 251, parameter $k_i$ is compared by the thermal runaway monitor 109 to a preset upper control limit (UCL) value ($k_{UCL}$) to determine whether semiconductor device 101 is close to thermal runaway triggering condition. If $k_i < k_{UCL}$, in step 265 a counter 115 (discussed in more detail below) is set to zero and a thermal runaway indicator is off. When $k_i < k_{UCL}$, this is an indication that semiconductor device 101 can continue its activity at the current level and it will be safe from triggering thermal runaway, and therefore the method 230 transitions to step 241 (where semiconductor device 101 continues its activities or it is activated) to continue thermal monitoring. However, if $k_i \geq k_{UCL}$, then in step 253, it is determined that a thermal runaway onset condition exists. In step 255, thermal runaway monitor 109 can send a warning message to host processor 113 that semiconductor device 101 is close to the thermal runaway condition (similar to step 225 of FIG. 2a).

In step 257, the active mode power of semiconductor device 101 is scaled down or reduced (also called "power gating" herein). For example, host processor 113 and/or thermal runaway monitor 109 is configured to send a signal to semiconductor device 101 and/or voltage supply 103 to reduce the power that is used during the active mode of semiconductor device 101. In one example, this reduction in power can result in slowing down some applications that are being run on semiconductor device 101. This reduction in power can include active voltage scaling and/or clock frequency control, (i.e. reducing the clock frequency that controls logic circuits in semiconductor device 101). By reducing the power during active mode of semiconductor device 101, the dynamic power is reduced, and therefore the total power consumed by semiconductor device 101 is reduced. The reduction in power can result in reduction in temperature of the semiconductor device 101. With lower temperature, the leakage current is expected to be lower. The dynamic current would be lower too because the dynamic power has decreased. Therefore, as total dissipated power is lower, the temperature also becomes lower as long as the dynamic current reduction sufficiently offsets any ongoing increase in the leakage current. In one example, lower temperature can result in a larger difference between two measured temperatures and therefore, lower $k_i$. In other words, $k_i$ will drop further away from the limit $k_{UCL}$.

In step 259, the value of a counter 115 is increased by thermal runaway monitor 109. This counter keeps track of the consecutive times where $k_i \geq k_{UCL}$. According to one example, the counter 115 can be stored in thermal runaway monitor 109 and/or memory 111.

In step 261, the current value of the counter 115 is compared by thermal runaway monitor 109 to a threshold value. If the counter's value is less than the threshold value, the method continues to step 241 to continue thermal monitoring. However, if the counter's value is more than the threshold value, then the thermal runaway monitor 109 can decide that the power gating of dynamic power (e.g., reducing the active power of semiconductor device 101) is not effective and therefore, in step 263, a signal is sent to semiconductor device 101 and/or power supply 103 to power off semiconductor device 101 so as to prevent permanent damage. In one example, this signal can be sent by host processor 113. Alternatively or additionally, thermal runaway monitor 109 can send the signal directly to semiconductor device 101 and/or power supply 103 to power off semiconductor device 101.

FIG. 2c illustrates another method for determining and controlling thermal runaway of semiconductor device 101 according to an embodiment of this disclosure. Steps 273-289 of method 270 of FIG. 2c are similar to steps 204-219 of method 200 of FIG. 2a, and therefore will not be repeated here.

In step 291, parameter $k_i$ is compared by the thermal runaway monitor 109 to a preset upper control limit (UCL) value ($k_{UCL}$) to determine whether semiconductor device 101 is close to the thermal runaway triggering condition. If $k_i \geq k_{UCL}$, in step 293, it is determined that a thermal runaway onset condition exists. In step 295, thermal runaway monitor 109 can send a warning message to host processor 113 that semiconductor device 101 is close to the thermal runaway condition (similar to step 225 of FIG. 2a). The warning message indicates that if semiconductor device 101 continues its activities at current level, it will likely trigger thermal runaway. For thermal runaway control, power gating (such as in method 230) or other methods can be applied for specific applications.

If $k_i < k_{UCL}$, in step 297 parameter $k_i$ is compared by the thermal runaway monitor 109 to a preset lower control limit (LCL) value ($k_{LCL}$). If $k_{LCL} \leq k_i < k_{UCL}$, an active power scaling factor (APSF) is calculated by the thermal runaway monitor 109 in step 298. The values of $k_{LCL}$ and $k_{UCL}$, can be stored in memory 111, for example. In one example APSF is calculated according to the following equation and can be stored in memory 111:

$$APSF = \frac{k_i - k_{LCL}}{k_{UCL} - k_{LCL}}$$

In step 299, semiconductor device 101 is instructed to scale down (reduce) its operating power according to the APSF value to keep it from getting close to the thermal runaway condition. For example, thermal runaway monitor 109 is configured to send a signal to semiconductor device 101 and/or voltage supply 103, directly or via the host processor 113, to reduce the power that is used during the active mode of semiconductor device 101 by the APSF value, which can be a percentage (e.g., 20-30%). As discussed above with respect to FIG. 2b, in one example, this reduction in power can result in slowing down some applications that are being run on semiconductor device 101. This reduction in power can include active voltage scaling and/or control of the clock frequency used by logic circuits. By reducing the power during active mode of semiconductor device 101, the dynamic power is reduced, and therefore the total power consumed by semiconductor device 101 is reduced.

After reducing the power, the method continues in step 281 (where semiconductor device 101 continues its activities or it is activated) to continue thermal monitoring. According to one example, the preset lower control limit (LCL) value ($k_{LCL}$) is determined at design and can be approximately 50%. However, it is noted that $k_{LCL}$ can include other values based on design and application of, for example, semiconductor device 101.

If $k_i < k_{LCL}$ in step 297, the method continues in step 281 to continue thermal monitoring without the implementation of any power scaling.

Although methods 200, 230, and 270 are discussed separately, it is noted that a combination of these methods can also be performed by, for example, thermal runaway monitor 109.

Figure 3A:
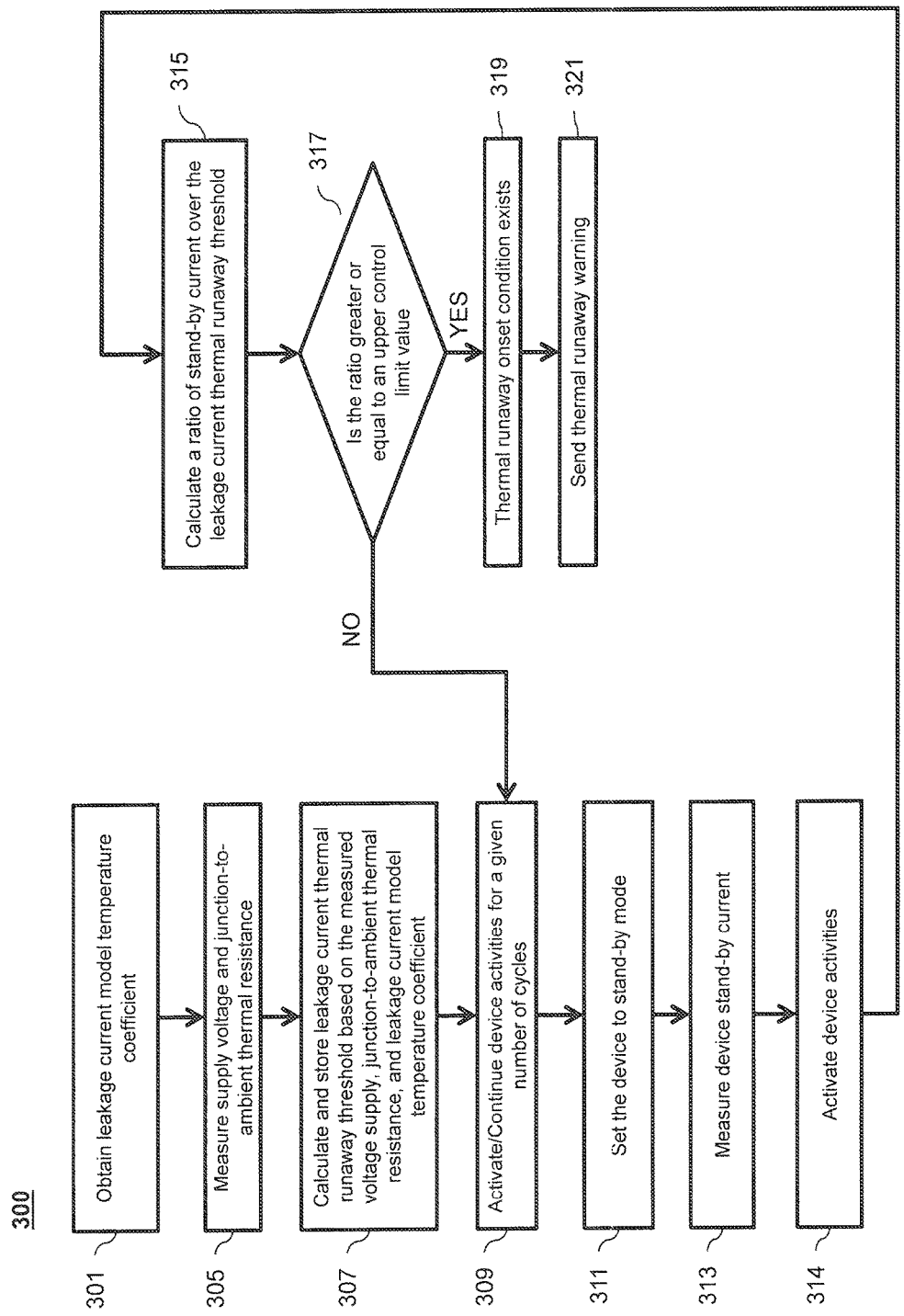
FIGS. 3a-3c illustrate flow charts of methods according to another embodiment.
Figure 3B:
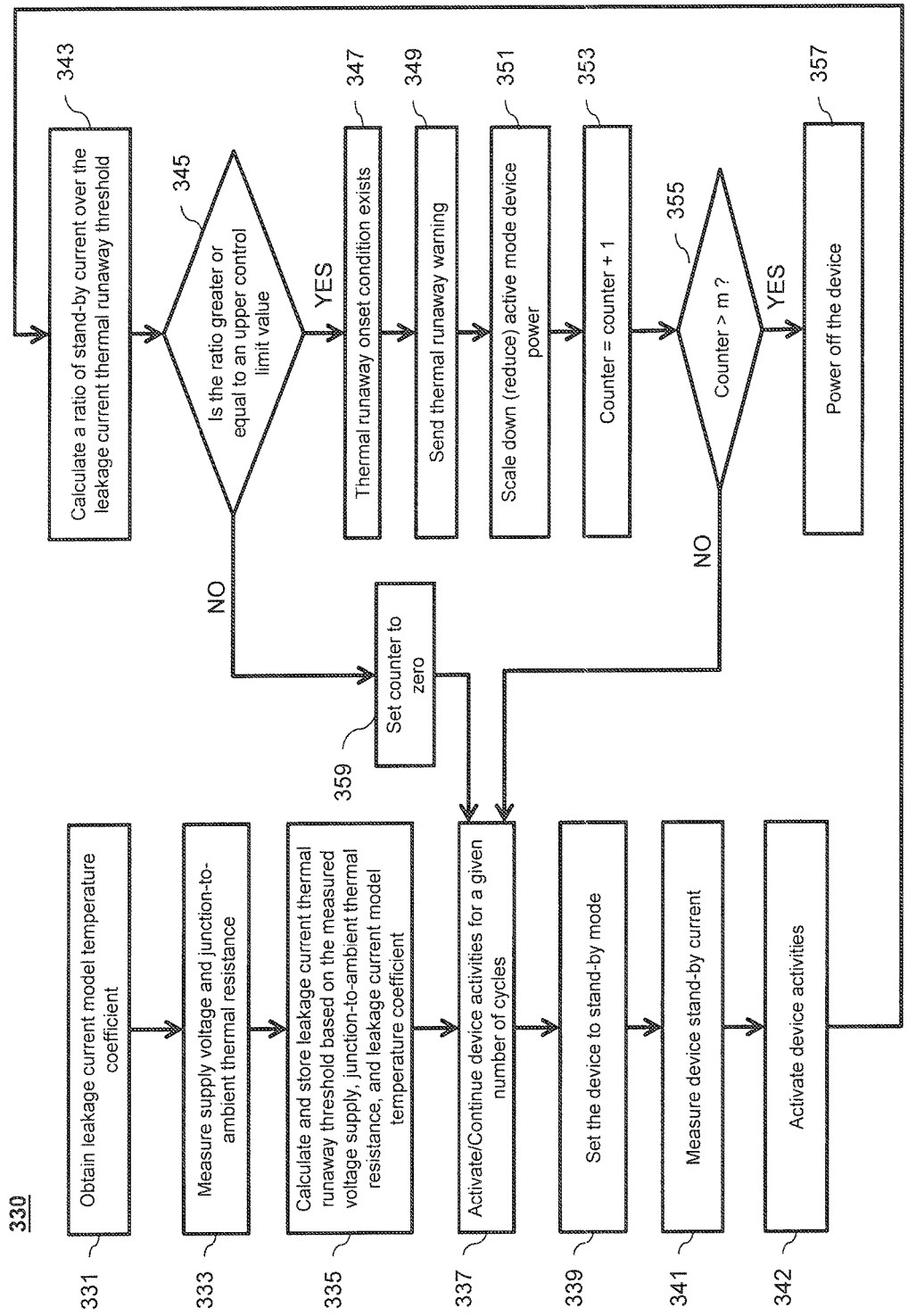
Figure 3C:
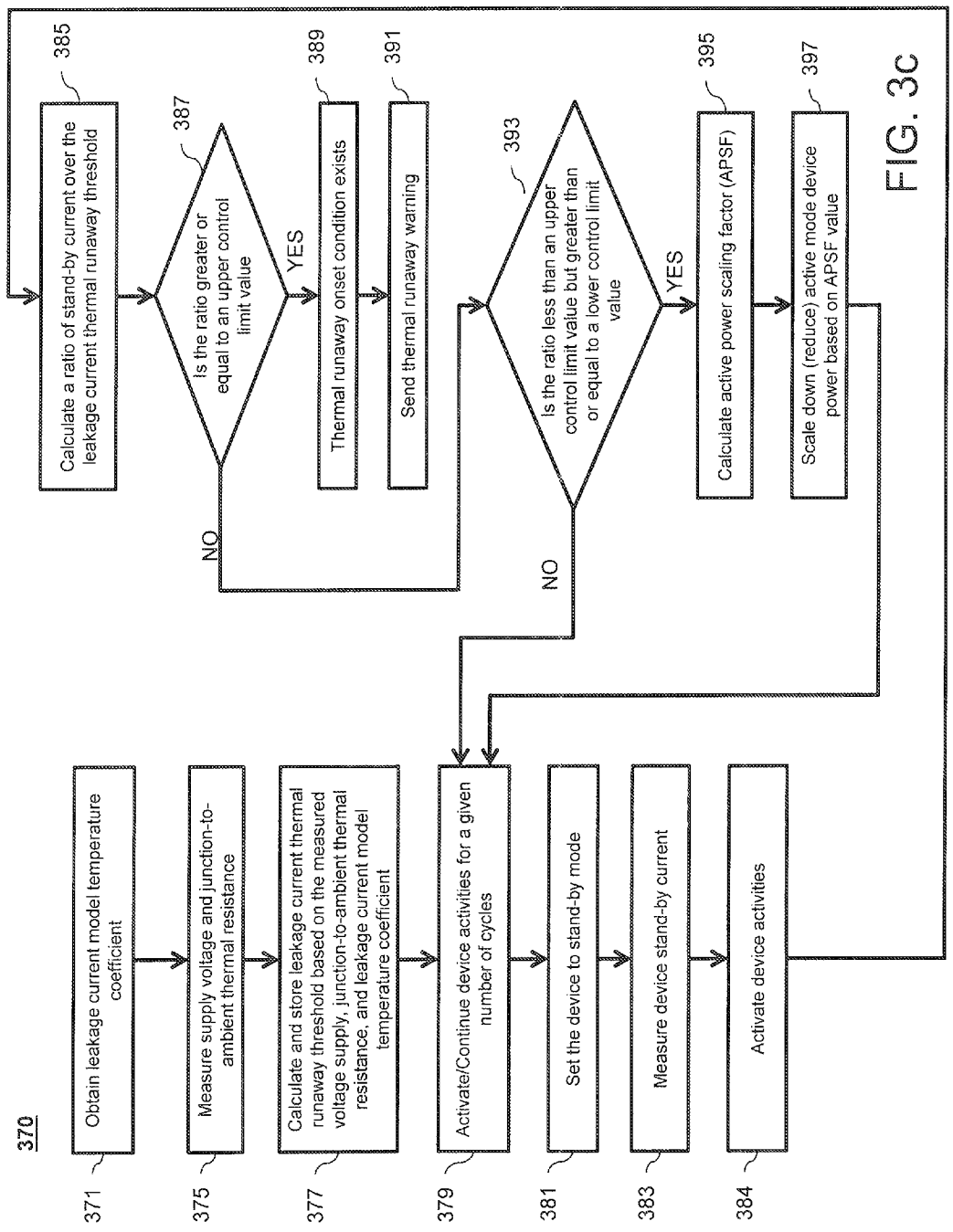

FIGS. 3a-3c illustrate flow charts of methods 300, 330, and 370 carried out by the architecture shown in FIG. 1, in accordance with another embodiment of the present disclosure. It is to be appreciated not that all steps may be needed to perform disclosure provided herein. Further, some of the steps may be performed simultaneously, or in a different order than that shown in FIGS. 3a-3c, as will be understood by those skilled in the art.

According to one example, methods 300, 330, and 370 of FIGS. 3a-3c can be performed by the thermal runaway monitor 109 alone or in accordance with one or more of temperature sensor 105, current sensor 107, memory 111, and host processor 113. According to methods 300, 330, and 370 of FIGS. 3a-3c, the thermal runaway monitor 109 is configured to determine whether semiconductor device 101 is close to a thermal runway condition by measuring the stand-by current of semiconductor device 101 and comparing it to a theoretical limit for leakage current. In one example, methods 300, 330, and 370 of FIGS. 3a-3c can be performed when semiconductor device 101 includes MOSFET devices.

The leakage current for an integrated circuit device can be modeled using equation (2) below:

$$I_{Leak} - I_0 = C_1(V_{dd})e^{C_2 T} \quad (2).$$

In equation (2) for a given process corner, $I_0$ is a constant, $C_1$ is a coefficient dependent on supply voltage $V_{dd}$ and $C_2$ (temperature coefficient) is also a constant. In one example, $C_1$ and $C_2$ can be obtained using a leakage simulation of semiconductor device 101. However, other techniques can be used to determine these coefficients. In this example, transistor leakage can include primarily: (1) subthreshold (source-drain), (2) gate, and (3) band-to-band—tunneling (BTBT, source/drain-to-substrate) leakages. Gate leakage is independent of temperature. Source/drain-to-substrate leakage is weakly dependent of temperature. Subthreshold leakage is exponentially related to temperature.

Leakage current that triggers the onset of thermal runaway at a known temperature in an application thermal environment can be derived from the above leakage model equation (2) and the thermal runaway onset condition equation (1) as the following:

$$(I_{Leak} - I_0)_{Limit} = \frac{1}{C_2 V_{dd} \theta_{JA}}. \quad (3)$$

In other words, if equation (2) is put into equation (1), equation (3) can be derived, which is the leakage current that triggers the onset of thermal runaway. It is assumed that $I_0$ is negligible in comparison with leakage current thermal runaway threshold $I_{Leak-Limit}$ ($I_0 \ll I_{Leak-Limit}$). Therefore, leakage current thermal runaway threshold is:

$$I_{Leak-Limit} \approx \frac{1}{C_2 V_{dd} \theta_{JA}}. \quad (4)$$

Similarly, the maximum temperature before the onset of thermal runaway occurs at given thermal environment can be calculated as:

$$T_{Limit} \approx \frac{1}{C_2} \text{Ln}\left(\frac{1}{C_1 C_2 V_{dd} \theta_{JA}}\right).$$

According to one example, $T_{Limit}$ can be used to monitor the thermal runaway condition for semiconductor device 101. In this example, coefficients $C_1$ and $C_2$ and semiconductor device 101 junction-to-ambient thermal resistance $\theta_{JA}$ can be measured/simulated/obtained and $T_{Limit}$ can be calculated. Therefore, the temperature of semiconductor device 101 can be measured during the normal operation and/or stand-by mode and the measured temperature can be compared to $T_{Limit}$ or a percentage of $T_{Limit}$ (to have some margin). In this example, if the measured temperature is approaching $T_{Limit}$, a warning can be sent or power gating can be performed. In other words any of methods 300, 330, and/or 370 as discussed below can be performed based on $T_{Limit}$ too.

Also, the thermal requirement to prevent thermal runaway during normal operation of the device and/or during testing of the device can be calculated as:

$$\theta_{JA-Limit} \approx \frac{1}{C_1 C_2 V_{dd}} e^{-C_2 T}.$$

It is also noted that in some embodiments minimum $\theta_{JA}$ must meet both power dissipation and thermal runaway requirements. For system total power dissipation requirement $$\theta_{JA} < \frac{T_J - T_A}{P_d}.$$

And for thermal runaway requirement for targeted $T_{J,max}$, $$\theta_{JA} < \frac{1}{C_1 C_2 V_{dd}} e^{-C_2 T_{J \cdot max}}.$$

In one example, $\theta_{JA-Limit}$ can be used to control thermal runaway for semiconductor device 101. In this example, coefficients $C_1$ and $C_2$ and supply voltage $V_{dd}$ can be measured/simulated/obtained, and for targeted $T_{J,max}$, $\theta_{JA-Limit}$ can be calculated. Therefore, during the design of semiconductor device 101, junction-to-ambient thermal resistance $\theta_{JA}$ can be chosen such that it would be less than $\theta_{JA-Limit}$.

In the embodiment discussed with respect to FIGS. 3a-3b, the value of leakage current thermal runaway threshold $I_{Leak-Limit}$ is used to determine whether semiconductor device 101 is getting close to the thermal runaway condition. As discussed in more detail below, a stand-by current of semiconductor device 101 can be measured and can be compared to leakage current thermal runaway threshold $I_{Leak-Limit}$ for such determination, where $I_{Leak-Limit}$ is defined by the equation (4) above. The measured stand-by current can include both leakage current and any current related to background activities of semiconductor device 101. However, the current related to background activities of semiconductor device 101 is smaller than leakage current during a thermal runaway, and therefore, does not materially affect the thermal runaway monitoring and control of the embodiments of this disclosure. In other words, if the semiconductor device 101 were to approach thermal runaway, then the current related to background activities will be insignificant.

Additionally or alternatively, the amount of current related to background activities of semiconductor device 101 can be known from the design of semiconductor device 101 (e.g., from a data sheet). Or the background current can be calculated using simulations of semiconductor device 101. Additionally or alternatively, the background current can be measured. Therefore, the amount of this background current can be subtracted from the measured stand-by current to determine a more accurate estimate of the leakage current.

Also, the leakage current can include logic circuit leakage (such as leakage related to standard cell, memories, and input/output (I/O) pad leakage) and analog circuit leakage. However, when there is change in temperature, analog circuit leakage change is negligible compared with logic circuit leakage. Therefore, in one example, leakage increase with temperature is dominated by logic circuits, such as standard cell and memory circuits.

FIG. 3a illustrates a flowchart of method 300 according to one embodiment. In step 301, leakage current model temperature coefficient $C_2$ is determined for a given process corner. For example, the temperature coefficient $C_2$ can be determined through curve-fitting leakage current data at various temperatures. The leakage current data can be obtained through design power simulations at target (fixed) supply voltage $V_{dd}$ and various temperatures using, for example, commercial software where the device is set to stand-by mode by turning off one or more, or all, activities. Other methods can also be used to estimate leakage current. The curve-fit leakage current model of equation (2) can generate both coefficients $C_1$ and $C_2$. For example, a logarithm of leakage versus temperature data can be curved fitted with a straight line to determine coefficients $C_1$ and $C_2$.

In step 305, the supply voltage and junction-to-ambient thermal resistance is measured and/or obtained. This can be done during the device's active mode and/or stand-by mode. As discussed above, thermal runaway monitor 109 alone or in combination with other circuits in device 100 can measure the supply voltage and junction-to-ambient thermal resistance. Also, it is noted that these measurements can either occur once or can be done multiple times during the operation of semiconductor device 101 to capture any changes that might occur in the supply voltage and junction-to-ambient thermal resistance. Alternatively or additionally, thermal runaway monitor 109 can obtain these values from semiconductor device 101 without measurement, as these values can be fixed and known values. For example, the junction-to-ambient thermal resistance can be predetermined and listed on a data sheet, and/or provided by the semiconductor manufacture, and thus pre-stored in the memory 111 for future access.

In step 307, the leakage current thermal runaway threshold $I_{Leak-Limit}$ is calculated by the thermal runaway monitor 109 based on the measured voltage supply, junction-to-ambient thermal resistance, and leakage current model temperature coefficient, as show in equation (4) above. The calculated leakage current thermal runaway threshold can be stored in, for example, memory 111 for further use.

In step 309, semiconductor device 101 continues its active mode (or is set to active mode if it was previously set to stand-by mode) for a given number of clock cycles so it can perform its normal operation as discussed above in reference to FIG. 2A.

In step 311, semiconductor device 101 is set to stand-by mode by the thermal runaway monitor 109. According to one example, semiconductor device 101 is performing its applications when thermal runaway monitor 109 sends an interruption message in step 311 to interrupt semiconductor device 101 activities and put it in a stand-by mode. In step 313, semiconductor device 101 stand-by current is measured by, for example, the current sensor 107. Further, in step 313, supply voltage $V_{dd}$ can optionally be measured again to check that it is the same target (fixed) supply voltage or within a sufficiently narrow fluctuation range so that the values of $C_2$ and $I_{Leak-Limit}$ are still valid for the monitoring/measurement. In step 314, the semiconductor device 101 is set to active mode to continue its activities. In step 315, a ratio of stand-by current relative to the leakage current thermal runaway threshold is calculated by the thermal runaway monitor 109, as $$k_i = \frac{I_i}{I_{Leak-Limit}}.$$

In step 317, parameter $k_i$ is compared to a preset upper control limit (UCL) value ($k_{UCL}$) to determine whether semiconductor device 101 is close to thermal runaway triggering condition. According to one example, $k_{UCL}$=80% so that there is a 20% margin from the theoretical onset thermal runaway condition. It is noted that other values of $k_{UCL}$ can also be considered. If $k_i$<$k_{UCL}$, the method continues in step 309, where semiconductor device 101 continues its normal activities and thermal runaway indicator is off. According to this example, steps 315 and 317 are performed during active mode of the semiconductor device 101. Additionally or alternatively, these steps can be performed during a stand-by mode and semiconductor device 101 can be activated in step 309.

If $k_i$≥$k_{UCL}$, in step 319, it is determined that a thermal runaway onset condition exists. In step 321, thermal runaway monitor 109 can send a warning message to host processor 113 that semiconductor device 101 is close to thermal runaway condition. As discussed above, host processor 113 can, for example, send a signal to semiconductor device 101 or turn on an indicator (such as an LED, text message, or sound indicator) to indicate that semiconductor device 101 is close to thermal runaway. Additionally or alternatively, thermal runaway monitor 109 can directly send a signal to semiconductor device 101 or turn on the monitor.

FIG. 3b illustrates another method for determining and controlling thermal runaway of semiconductor device 101 according to another embodiment of this disclosure. Steps 331-343 of method 330 of FIG. 3b are similar to steps 301-315 of method 300 of FIG. 3a, and therefore will not be repeated here.

In step 345, parameter $k_i$ is compared by the thermal runaway monitor 109 to a preset upper control limit (UCL) value ($k_{UCL}$) to determine whether semiconductor device 101 is close to the thermal runaway triggering condition. If $k_i$<$k_{UCL}$ in step 357, a counter 115 is set to zero in step 359 and the thermal runaway indicator is off. When $k_i$<$k_{UCL}$, then this is an indication that semiconductor device 101 can continue its activity at the current level and it will be safe from triggering thermal runaway, and method 330 continues in step 337 (where semiconductor device 101 continues its active mode or it is activated) to continue thermal monitoring. However, if $k_i$≥$k_{UCL}$, in step 347, it is determined that a thermal runaway onset condition exists. In step 349, thermal runaway monitor 109 can send a warning message to host processor 113 that semiconductor device 101 is close to the thermal runaway condition (similar to step 321 of FIG. 3a).

In step 351, the active mode power of semiconductor device 101 is scaled down or reduced. For example, thermal runaway monitor 109 and/or host processor 113 is configured to send a signal to semiconductor device 101 and/or voltage supply 103 to reduce the power that is used during the active mode of semiconductor device 101. In one example, this reduction in power can result in slowing down some applications that are being run on semiconductor device 101. In step 353, the value of a counter 115 is increased by the thermal runaway monitor 109. This counter keeps track of the consecutive times where $k_i$≥$k_{UCL}$. According on one example, the counter can be stored in thermal runaway monitor 109 and/or memory 111.

In step 355, the current value of the counter 115 is compared to a threshold value. If the counter's value is less than the threshold value, the method continues in step 337 (where semiconductor device 101 continues its active mode or it is activated). However, if the counter's value is more than the threshold value, thermal runaway monitor 109 can decide that the power gating of dynamic power (e.g., reducing the active power of semiconductor device 101) is not effective and therefore, in step 357, a signal is sent to semiconductor device 101 to power it off to prevent permanent damage. In one example, this signal can be sent by host processor 113. Alternatively or additionally, thermal runaway monitor 109 can send the signal directly to semiconductor device 101 and/or power supply 103 to power off semiconductor device 101.

FIG. 3c illustrates another method for determining and controlling thermal runaway of semiconductor device 101 according to another embodiment of this disclosure. Steps 371-385 of method 370 of FIG. 3c are similar to steps 301-315 of method 300 of FIG. 3a, and therefore will not be repeated here.

In step 387, parameter $k_i$ is compared by the thermal runaway monitor 109 to a preset upper control limit (UCL) value ($k_{UCL}$) to determine whether semiconductor device 101 is close to thermal runaway triggering condition. If $k_i$≥$k_{UCL}$, in step 389, it is determined that a thermal runaway onset condition exists. In step 391, thermal runaway monitor 109 can send a warning message to host processor 113 that semiconductor device 101 is close to thermal runaway condition (similar to step 321 of FIG. 3a). This indicates that if semiconductor device 101 continues its activities at the current level, it will likely trigger thermal runaway. For thermal runaway control, power gating (such as method 330) or other method can be applied for specific applications.

If $k_i$<$k_{UCL}$, in step 393 parameter $k_i$ is compared by the thermal runaway monitor 109 to a preset lower control limit (LCL) value ($k_{LCL}$). If $k_{LCL}$≤$k_i$≤$k_{UCL}$, an active power scaling factor (APSF) is calculated in step 395. In one example APSF is calculated according to the following equation and can be store in memory 111:

$$APSF = \frac{k_i - k_{LCL}}{k_{UCL} - k_{LCL}}$$

In step 397, semiconductor device 101 is instructed to scale down (reduce) its operating power by the APSE value to keep it from getting close to the thermal runaway condition. For example, thermal runaway monitor 109 is configured to send a signal to semiconductor device 101 and/or voltage supply 101 directly or via the host processor 113, to reduce the power that is used during the active mode of semiconductor device 101 by the APSF value, which can be a percentage (e.g., 20-30%). As discussed above with respect to FIG. 2b, in one example, this reduction in power can result in slowing down some applications that are being run on semiconductor device 101. This reduction in power can include active voltage scaling and/or control of the clock frequency used to clock circuits. By reducing the power during the active mode of semiconductor device 101, the dynamic power is reduced, and therefore the total power consumed by semiconductor device 101 is reduced.

After reducing the power, the method continues in step 379 (where semiconductor device 101 continues its active mode or it is activated) for continued thermal monitoring. According to one example, the preset lower control limit (LCL) value ($k_{LCL}$) is determined at design and can be approximately 50%. However, it is noted that $k_{LCL}$ can include other values based on design and application of, for example, semiconductor device 101.

If $k_i < k_{LCL}$, the method continues in step 379 (where semiconductor device 101 continues its active mode or it is activated) for continued thermal monitoring.

Although methods 300, 330, and 370 are discussed separately, it is noted that a combination of these methods can also be performed by, for example, thermal runaway monitor 109.

The exemplary embodiments described herein are provided for illustrative purposes, and are not limiting. Other exemplary embodiments are possible, and modifications may be made to the exemplary embodiments within the spirit and scope of the disclosure.

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments. Further, the claims should be defined only in accordance with their recitations and their equivalents.

What is claimed is:

1. A semiconductor-based apparatus, comprising:
   a semiconductor device;
   a current sensor configured to measure a first stand-by current and a second stand-by current of the semiconductor device;
   a temperature sensor configured to measure a first temperature and a second temperature of the semiconductor device; and
   a thermal runaway monitor, configured to:
      determine a ratio of a first difference relative to a second difference, the first difference being between the first stand-by current and the second stand-by current of the semiconductor device, and the second difference being between the first temperature and the second temperature of the semiconductor device; and
      determine whether a thermal runaway onset condition exists based on the ratio.

2. The semiconductor-based apparatus of claim 1, wherein the current sensor is configured to measure the first stand-by current and the second stand-by current of the semiconductor device at respective first and second instances in time.

3. The semiconductor-based apparatus of claim 2, wherein the temperature sensor is configured to measure the first temperature and the second temperature of the semiconductor device at the respective first and second instances in time.

4. The semiconductor-based apparatus of claim 1, wherein the thermal runaway monitor is further configured to determine a parameter by dividing the ratio by an inverse of a product, the product being a multiplication of a supply voltage of the semiconductor device and a junction-to-ambient thermal resistance of the semiconductor device.

5. The semiconductor-based apparatus of claim 4, wherein the thermal runaway monitor is further configured to:
   compare the parameter with a preset upper control limit value; and
   determine that the thermal runaway onset condition exists when the parameter is greater than or equal to the preset upper control limit value.

6. The semiconductor-based apparatus of claim 5, wherein the thermal runaway monitor is further configured to:
   compare the parameter with a preset lower control limit value when the parameter is less than the preset upper control limit value;
   if the parameter is greater than or equal to the preset lower control limit value, calculate an active power scaling factor; and
   send a request to the semiconductor device to reduce its active mode power by the active power scaling factor.

7. The semiconductor-based apparatus of claim 5, wherein the thermal runaway monitor is further configured to send a message to a host processor of the semiconductor-based apparatus upon determination that the thermal runaway onset condition exists.

8. The semiconductor-based apparatus of claim 5, wherein the thermal runaway monitor comprises a counter, and the thermal runaway monitor is further configured to:
   send a request to the semiconductor device to reduce its active mode power when the thermal runaway onset condition exists;
   increase a value of the counter by one when the thermal runaway onset condition exists;
   compare the value of the counter to a predetermined threshold; and
   send a power off signal to the semiconductor device to turn off the semiconductor device when the value of the counter is greater than the predetermined threshold.

9. The semiconductor-based apparatus of claim 1, wherein the thermal runaway monitor is further configured to send a request to the semiconductor device to reduce its active mode power when the thermal runaway onset condition exists.

10. A method, comprising:
measuring, using a current sensor, a first stand-by current and a second stand-by current of a semiconductor device;
measuring, using a temperature sensor, a first temperature and a second temperature of the semiconductor device;
determining, using a thermal runaway monitor, a ratio of a first difference relative to a second difference, the first difference being between the first stand-by current and the second stand-by current of the semiconductor device, and the second difference being between the first temperature and the second temperature of the semiconductor device; and
determining, using the thermal runaway monitor, whether a thermal runaway onset condition exists based on the ratio.

11. The method of claim 10, wherein the measuring the first stand-by current and the second stand-by current of the semiconductor device is at respective first and second instances in time.

12. The method of claim 11, wherein the measuring the first temperature and the second temperature of the semiconductor device is at the respective first and second instances in time.

13. The method of claim 10, further comprising:
determining a parameter by dividing the ratio by an inverse of a product, the product being a multiplication of a supply voltage of the semiconductor device and a junction-to-ambient thermal resistance of the semiconductor device.

14. The method of claim 13, further comprising:
comparing the parameter with a preset upper control limit value; and
determining that the thermal runaway onset condition exists if the parameter is greater than or equal to the preset upper control limit value.

15. The method of claim 14, wherein the thermal runaway monitor comprises a counter, the method further comprising:
sending a request to the semiconductor device to reduce its active mode power when the thermal runaway onset condition exists;
increasing a value of the counter by one when the thermal runaway onset condition exists;
comparing the value of the counter to a predetermined threshold; and
sending a power off signal to the semiconductor device when the value of the counter is greater than the predetermined threshold to turn off the semiconductor device.

16. The method of claim 14, further comprising:
comparing the parameter with a preset lower control limit value when the parameter is less than the preset upper control limit value;
if the parameter is greater than or equal to the preset lower control limit value, calculating an active power scaling factor; and
sending a request to the semiconductor device to reduce its active mode power by the active power scaling factor.

17. The method of claim 10, further comprising:
sending a request to the semiconductor device to reduce its active mode power when the thermal runaway onset condition exists.

18. A semiconductor-based apparatus, comprising:
a semiconductor device;
a current sensor configured to measure a stand-by current of the semiconductor device; and
a thermal runaway monitor, configured to:
determine a ratio of the stand-by current to a leakage current thermal runaway threshold; and
determine whether a thermal runaway onset condition exists based on the ratio.

19. The semiconductor-based apparatus of claim 18, wherein the thermal runaway monitor is further configured to:
compare the ratio with a preset upper control limit value; and
determine that the thermal runaway onset condition exists when the ratio is greater than or equal to the preset upper control limit value.

20. The semiconductor-based apparatus of claim 19, wherein the thermal runaway monitor comprises a counter and the thermal runaway monitor is further configured to:
send a request to the semiconductor device to reduce its active mode power when the thermal runaway onset condition exists;
increase a value of the counter by one when the thermal runaway onset condition exists;
compare the value of the counter to a predetermined threshold; and
send a power off signal to the semiconductor device to turn off the semiconductor device when the value of the counter is greater than the predetermined threshold.

21. The semiconductor-based apparatus of claim 19, wherein the thermal runaway monitor is further configured to:
compare the ratio with a preset lower control limit value when the ratio is less than the preset upper control limit value;
if the ratio is greater than or equal to the preset lower control limit value, calculate an active power scaling factor; and
send a request to the semiconductor device to reduce its active mode power by the active power scaling factor.

22. A semiconductor-based apparatus, comprising:
a semiconductor device;
a current sensor configured to measure a stand-by current of the semiconductor device; and
a thermal runaway monitor, configured to:
obtain a leakage current model temperature coefficient;
determine a leakage current thermal runaway threshold based on the leakage current model temperature coefficient, a supply voltage of the semiconductor device, and a junction-to-ambient thermal resistance of the semiconductor device;
determine a ratio of the stand-by current to the leakage current thermal runaway threshold; and
determine whether a thermal runaway onset condition exists based on the ratio.

* * * * *